United States Patent
Dürig et al.

[11] Patent Number: 5,966,053
[45] Date of Patent: Oct. 12, 1999

[54] APPARATUS AND METHOD FOR CONTROLLING A MECHANICAL OSCILLATOR

[75] Inventors: Urs Dürig, Rueschlikon; Alain Stalder, Adliswil; Hansruedi Steinauer, Horgen, all of Switzerland

[73] Assignee: International Business Machines Corporation, Armonk, N.Y.

[21] Appl. No.: 08/930,834
[22] PCT Filed: Apr. 10, 1995
[86] PCT No.: PCT/IB95/00252
§ 371 Date: Jan. 20, 1998
§ 102(e) Date: Jan. 20, 1998
[87] PCT Pub. No.: WO96/32623
PCT Pub. Date: Oct. 17, 1996
[51] Int. Cl.⁶ .................................................. H03B 5/30
[52] U.S. Cl. .................... 331/116 M; 331/35; 331/156; 331/183
[58] Field of Search .............................. 331/116 M, 156, 331/183, 155, 34, 35; 327/516

[56] References Cited

U.S. PATENT DOCUMENTS

4,177,434  12/1979  Ida ............................................ 331/27

Primary Examiner—Arnold Kinkead
Attorney, Agent, or Firm—McGinn & Gibb, P.C

[57] ABSTRACT

An improvement to a phase controlled mechanical oscillator consists of a balancing network which generates a feedback signal from two different input signals with adjustable weights. One of these input signals is directly derived from the oscillator signal, the other is derived from a phase tracking loop. Using the balancing network, adjustments can be made to adapt the feedback to the mechanical properties, in particular to the Q factor, of the oscillator. In a preferred embodiment, all major components are working at an intermediate frequency level, generated by mixing the oscillator frequency with a reference frequency. As a major advantage of this (heterodyne) mixing, the bandwidth of any applied frequency detector can be narrowed, thus increasing the achievable signal-to-noise ratio.

20 Claims, 9 Drawing Sheets

APPARATUS AND METHOD FOR CONTROLLING A MECHANICAL OSCILLATOR

This invention pertains to an apparatus and a method for controlling a mechanical oscillator, in particular a flexible micromechanical element, as encountered for example in the field of Scanning Probe Microscopy.

BACKGROUND OF THE INVENTION

The field of the invention are micromechanical appliances which include a flexible element. In many cases it is desired to control the oscillation of such an element under the influence of internal and external forces. A typical micromechanical appliance of the kind at which the current invention is aiming, is known as Scanning or Atomic Force Microscopy (SFM or AFM) and methods related to it.

The Atomic Force Microscope as first known from the U.S. Pat. No. 4,724,318 and further described by G. Binnig, C. F. Quate and Ch. Gerber in Phys. Rev. Letters, Vol.56, No.9, March 1986, pp.930–933, employs a sharply pointed tip attached to a spring-like flexible element, typically in form of a cantilever beam, to scan the profile of a surface to be investigated. At the distances involved, minute forces occur between the atoms at the apex of the tip and those at the surface, resulting in a tiny deflection of the cantilever. The forces occurring between a pointed tip and a surface are usually described as van-der-Waals, covalent, ionic, or repulsive core interaction forces.

Applications of the AFM can roughly be divided into two different groups in accordance with the way in which these forces are detected. In the so-called direct or contact mode, a force map of a surface is derived by measuring the deflection of the cantilever. The second mode is characterized by detecting shifts in the resonant frequency of the mechanical vibration of a cantilever. This mode of operation is known as non-contact, "AC", or attractive mode. The non-contact mode results in a force gradient map of a surface. The most commonly used detection method in the non-contact mode, which is known as "slope detection", involves driving the cantilever at a fixed frequency close to its resonance. The resonant frequency of such a cantilever is given by the square root of k/m, wherein m is the effective mass of the lever and k is the effective spring constant. This effective spring constant is defined as being the sum of the spring constant of the (free) cantilever beam plus the gradient of the force at a direction perpendicular to the surface of a sample. A change in this gradient gives rise to a shift in the resonant frequency, and a corresponding shift in the amplitude of the cantilever vibration. In slope detection the signal is derived by measuring this change in amplitude.

The applicability of the slope detection method is limited by the maximum quality factor Q of the cantilever's resonance. It is in principle possible to achieve very high Q values by carefully designing the cantilever and reducing the damping by air. But the high Q value effects adversely the time constant and hence the available bandwidth. The resulting apparatus is for most applications too slow. The disadvantages of the slope detection method lead to a number of attempts to increase the sensitivity through higher Q values without placing any restriction on the bandwidth or the dynamic range. These attempts are characterized by employing the cantilever as the frequency determining element within a feedback oscillator circuitry. T. R. Albrecht et al. describe for example in J. Appl. Phys. 69 (2), Jan. 16, 1991, pp. 668–673, a setup which includes in addition to a conventional force microscope with a bimorph cantilever an oscillator control amplifier and an FM demodulator circuit. A similar scheme is published by U. Dürig et al. in J. Appl. Phys. 72(5), Sep. 1, 1992, pp. 1778–1798. Therein the resonant frequency of the cantilever is detected by means of a Phase Locked Loop (PLL) phase/frequency detector. The output of the PLL circuit is also used after an appropriate phase shifting and amplifying to excite the vibration amplitude of the cantilever as to maintain a constant level. The invention strives to improve these solutions without giving up the inherent advantages of not requiring a quantitative measurement of the cantilever's deflection and of maintaining its oscillation at a constant amplitude.

SUMMARY OF THE INVENTION

The above-mentioned and other objects and advantages are attained in accordance with the principles of the present invention as set forth in the appended claims.

Accordingly, in a basic variant the apparatus in accordance with the invention comprises a flexible mechanical element e.g. a cantilever, electromechanical transducer means to excite a vibration of the flexible element, an excitation control circuit, a feedback output signal of which is connected to said transducer means. The apparatus further comprises linear feedback means to generate a first feedback input signal and tracking oscillator means to generate a second feedback input signal, balancing network means for combining the first and the second feedback input signal to a single feedback signal being an input signal of the excitation control circuit.

The linear feedback means preferably derives its output signal directly from the vibration signal of the flexible element. The tracking oscillator means preferably comprises an internal oscillator signal as a reference signal, to which the vibration signal of the flexible element is compared in a manner which is known in the art as phase locking. The balancing network allows to select any combination of the feedback input signals as feedback signal to the flexible element. The relative weights of the feedback input signals can preferably be adjusted. Two extreme weightings are conceivable: For a flexible element with a high Q factor, a feedback signal solely derived from the linear feedback could be sufficient. In the other mode, the driving or excitation signal for the flexible element is proportional to the tracking oscillator signal. This operating mode is particularly advantageous when working with low Q resonators which provide only little selective amplification at their resonance frequency. In such situations linear feedback may be unsatisfactory as it cannot be excluded that self oscillation sets in at some spurious side resonance which has higher gain than the resonant element. In the tracking oscillator mode, however, excitation of side resonances with frequencies outside the capture range of the PLL can be effectively suppressed by adjustment of the capture or locking range of the tracking oscillator means. The inventive apparatus is thus adaptable to a very broad range of mechanical resonators irrespectively of their mechanical properties.

Another preferred embodiment of the invention comprises a local oscillator and mixing means. In the mixing circuit, the signals generated by the local oscillator are combined with those originating from the vibrations of the flexible element. The mixer provides a signal which oscillates at a frequency to which following circuit stages, in particular the phase and/or frequency detection, are optimized. For deriving a feedback signal, the original frequency has to be restored by a second mixing stage. The local oscillator provides also an input to this (de-)mixer. In particular when applying non-linear devices in the mixing circuit, its output contains components oscillating at the difference and/or sum of the input signal frequencies. Using suitable filters, all unwanted components of the signal are suppressed. The general principle of applying a frequency mixing before further signal processing is known for example in FM radio demodulation as "heterodyne" technique. Therefore, this term is often used in the following when referring to this embodiment of the invention. The heterodyne principle allows to operate the phase controlled oscillator as described above over a wide frequency span. Nevertheless, the frequency detector can be restricted to a small bandwidth, which in turn increases its resolution as the noise of a frequency detector is proportional to the 1.5th power of the detector's bandwidth.

In a variant of this embodiment, the mixing stage and the demixing stage form a bracket around all major components of the apparatus excluding only minor (pre-)amplifiers and the electromechanical transducer(s). In this variant, all important signal processing is done in the mixed or intermediate frequency regime. Though this variant has advantages concerning design, layout, and matching of the separate components of the signal processing circuitry, the scope of the invention also includes variants in which the heterodyne principle is applied only to one or more of these components. One variant may use the heterodyne principle for instance only for those signals which are passed on to the tracking oscillator circuit leaving the balancing network together with the linear feedback means in the original frequency domain.

A further preferred embodiment of the invention comprises adjustable phase shifting means in the feedback loop which excites the vibration of the mechanical element. The phase shift according to the current invention is achieved by a linear combination of the feedback signal and its quadrature, i.e. $\pi/2$ shifted, signal. The phase shift is electronically controllable, hence, provides means for measuring precisely the Q-factor of the mechanical oscillator. The proposed phase shifter is also independent of the frequency of the feedback signal. The latter is important for an accurate measurement of the resonance frequency.

These and other novel features believed characteristic of the invention are set forth in the appended claims. The invention itself however, as well a preferred mode of use, and further objects and advantages thereof, will best be understood by reference to the following detailed description of illustrative embodiments when read in conjunction with the accompanying drawings.

DESCRIPTION OF THE DRAWINGS

The invention is described in detail below with reference to the following drawings.

MODE(S) FOR CARRYING OUT THE INVENTION

Figure 1:
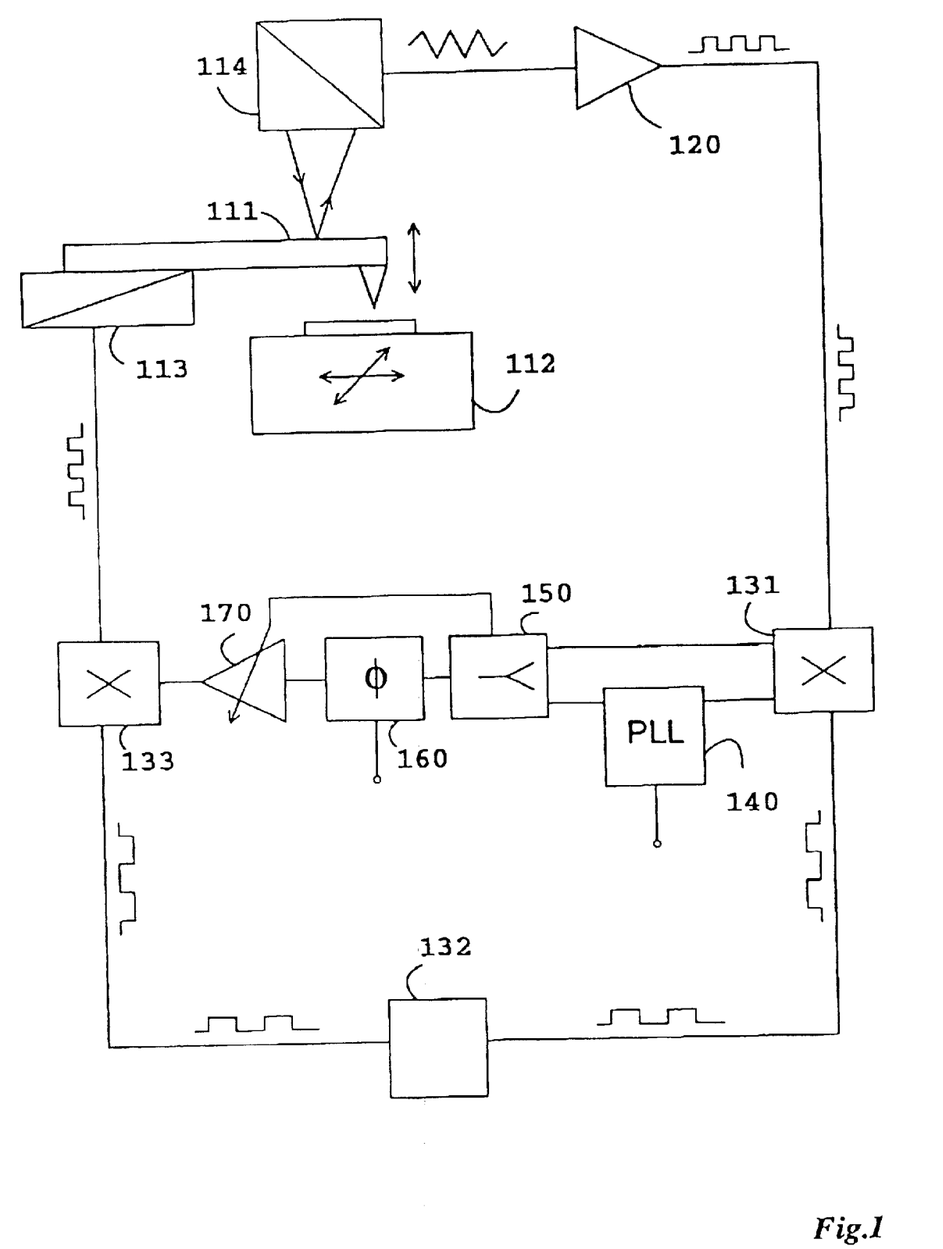
FIG. 1 shows a schematic drawing of an embodiment according to the invention.

Referring now to FIG. 1, an embodiment of the invention is described, wherein the mechanical oscillator is a cantilever beam (CB) 111 basically etched from silicon. Attached to it is a fine tip which can be lowered onto the surface of a sample mounted on a x-y positioning device 112. The cantilever 111 is excited to vibrate at its resonant frequency by a piezoelectric transducer 113. An opto-electrical transducer 114 is applied to detect the vibration of the cantilever and thereof an electrical signal oscillating at the cantilever's frequency. This signal is referred to as CB response. The setup described so far does not deviate from known atomic force microscopes. In fact, a lot of variations may be thought of in which single components are replaced; the cantilever 111 can be built such as to incorporate a transducer for measuring its vibration frequency as well as a transducer for exciting this vibration, for example by combining a bimorph type CB with a piezoresistive deflection sensor. However, the current invention is mainly concerned with the components as described in the following.

After appropriate signal amplification and shaping 120, the signal is connected to the input of a frequency mixer 131, to which a second signal, oscillating at a different frequency, is provided by means of a local oscillator 132. After appropriate filtering and suppressing all undesired components, the lower sideband signal, which corresponds to the subtractive mixing, is connected to a phase tracking circuit 140 and also directly to a balancing network 150. The tracking circuit provides not only the input signal to the following balancing network but is preferably also employed to determine a frequency shift of the CB response signal. The frequency detection as such, however, could equally be performed by other methods, e.g., quadrature detecting.

Within the balancing network 150 an adjustable mixture of both input signals is used to derive a feedback signal for maintaining the vibration of the CB 111. Also within the feedback loop is a phase shifting circuit 160 which establishes a proper phase relation between the driving signal provided by the feedback loop and the CB response signal, the phase relation being such that the oscillation frequency is exactly at the peak of the resonance curve of the CB, i.e. acting as a phase controlled oscillator (PCO). This has two important consequences. Firstly, the oscillation frequency is virtually independent of the Q-factor of the resonance. Hence, the precision of force gradient measurements is not limited by the natural line width of the resonance. Secondly, excitation and damping of the CB oscillation can be most effectively performed since energy transfer into and out of the CB is optimal under these conditions.

A gain controlled amplitude regulating device 170 adjusts the amplitude of the feedback signal to a preselected value before it is reconverted into the frequency domain of the CB by means of a second mixer 133. This mixer also receives its reference frequency from the local oscillator 132. The feedback signal is then transmitted to the electro-mechanical transducer 113, which excites the CB 111 such as to maintain its oscillation.

While making reference to FIGS. 2 to 8, a practical implementation of the heterodyne phase controlled oscillator (HPCO) as outlined above will now be described in detail. The HPCO is designed to be used with CB-resonators with resonance frequencies ranging from 1 kHz up to 2 MHz. The dynamic range of the oscillator is 10 kHz which means that the resonance frequency can change by as much as +/−5 kHz about its mean value without adjustment of the local oscillator or, alternatively, small variations of the resonance frequency can be tracked with a bandwidth of 5 kHz. It is important to note in this context that the maximum phase error is less than +/−2 degree over the entire 10 kHz bandwidth of the HPCO. This assures accuracy of force gradient and dissipation measurements under all operating conditions. The HPCO circuit includes a phase locked loop frequency detector with a sensitivity of better than 0.2 Hzrms at a bandwidth of 1 kHz and an absolute accuracy of better than 5 Hz. The phase of the output signal with respect to the input signal can be continuously adjusted over a range of 400 degrees. In addition, the phase shift can be modulated for Q-factor measurements. The amplitude of oscillation is feedback controlled with a response time of less than 1 ms.

Figure 2:
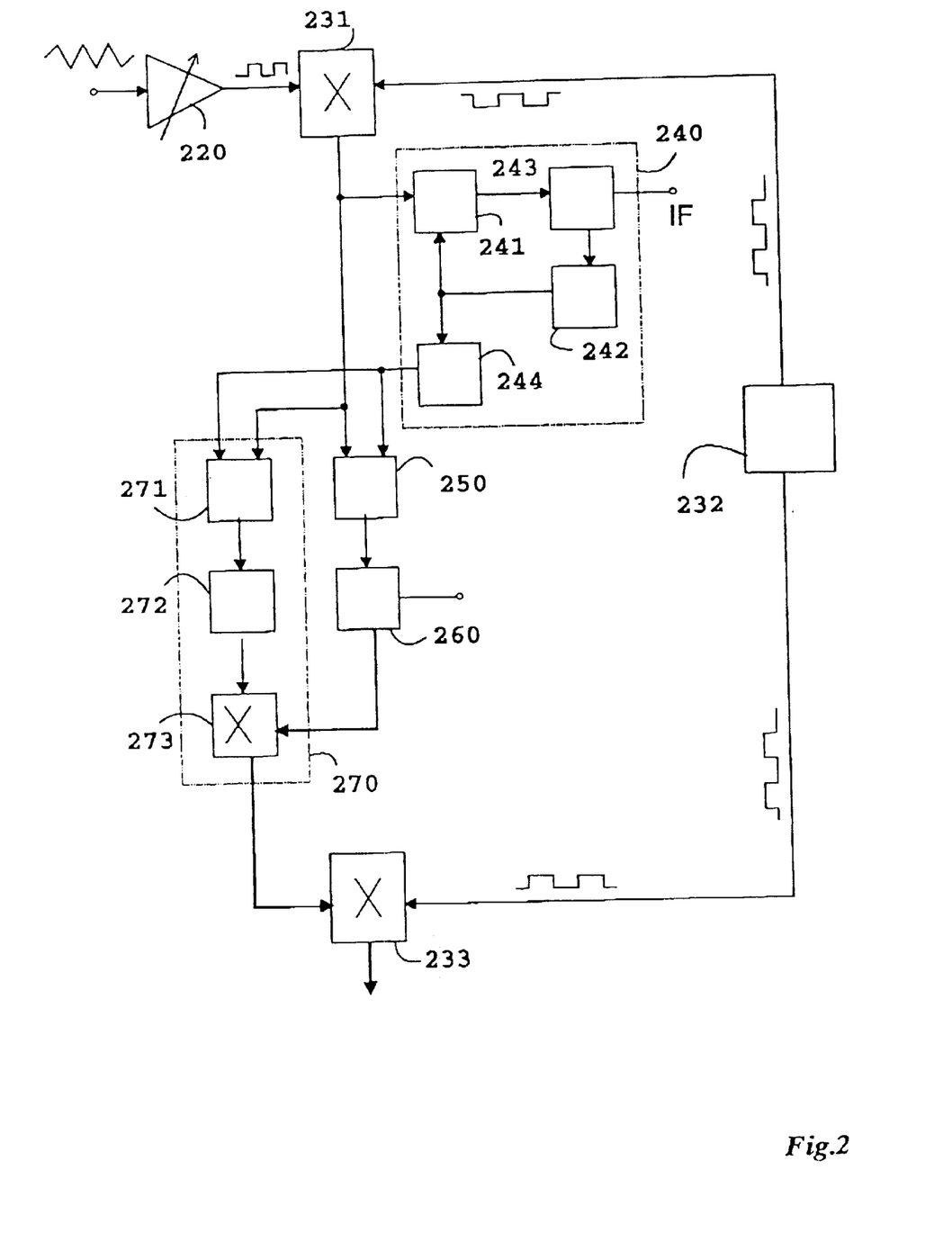
FIG. 2 shows details of the embodiment of FIG. 1.
Figure 3:
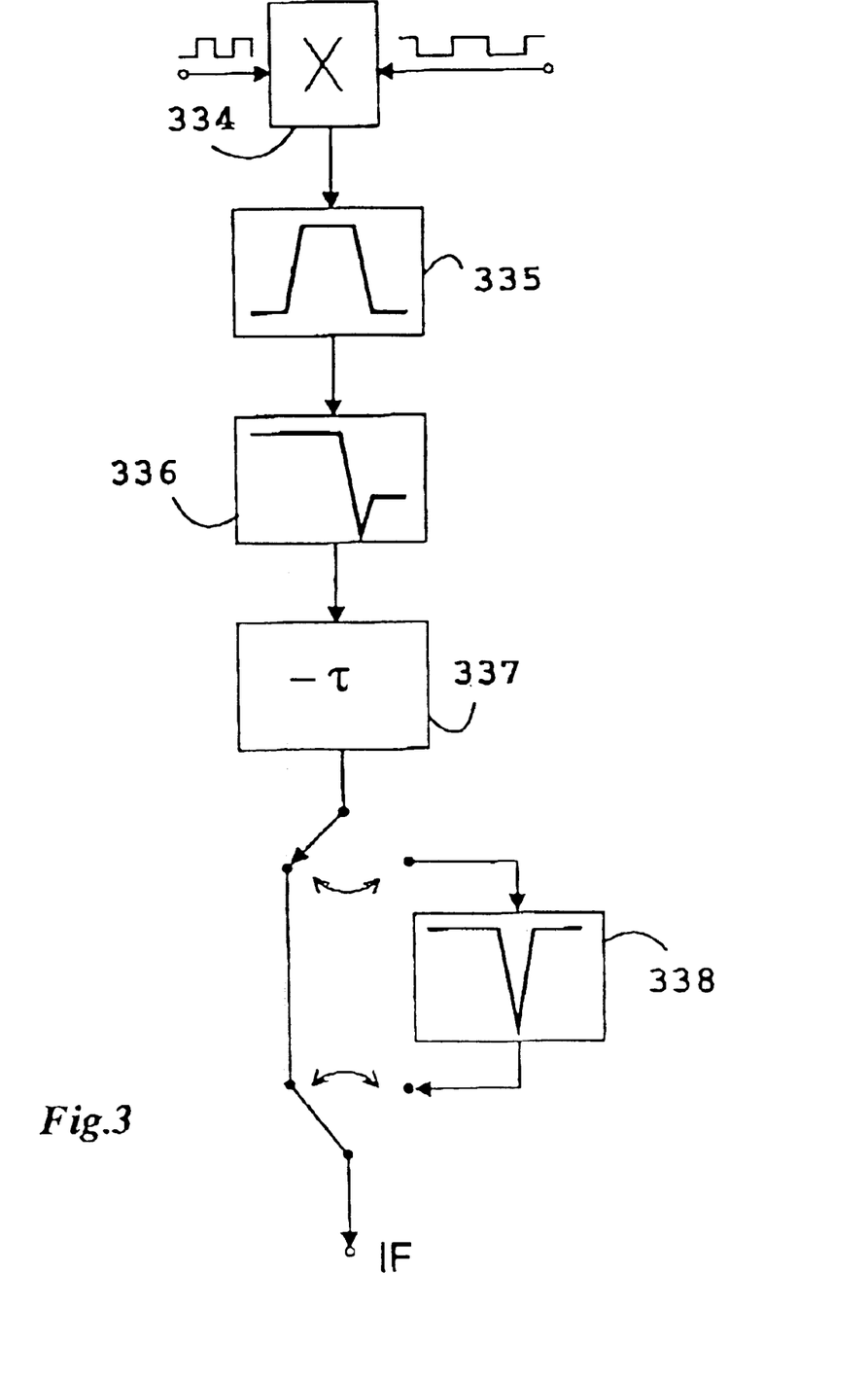
FIG. 3 illustrates an input mixer of the system of FIG. 2 according to the present invention.

A block diagram of the HPCO is depicted in FIG. 2. The intermediate frequency is at 35±5 kHz. It is obtained by subtractive mixing of the input signal with the local oscillator signal, viz. the intermediate frequency is equal to the local oscillator frequency minus the input frequency. Similarly, the output signal is restored by subtractive mixing of the intermediate frequency with the local oscillator.

In the following, single components as appearing in FIG. 2 are specified.

Input Amplifier 220: The CB response signal is amplified by a broad band input amplifier with an adjustable gain between 0.1 and 100. The amplifier serves for establishing a constant signal level of nominally 1 Vrms within the HPCO.

Input mixer 231: A detailed view of the input mixer is presented by FIG. 3. The amplified CB response signal is mixed with the local oscillator signal using a precision analog multiplier 334. The upper and lower sidebands, corresponding to additive and subtractive mixing, appear at the output of the mixer. The upper sideband is suppressed by subsequent filtering. The filter consists of a 2nd order bandpass filter 335, having a mean frequency of 35 kHz and a bandwidth of 23 kHz, providing selective gain within the IF frequency range followed by a 4th order elliptical low-pass filter 336. The latter provides greater than 50 dB rejection for frequencies above 90 kHz. Filtering introduces delays into the signal path which means that the phase changes with frequency. However, the phase response must be flat within the IF frequency range from 30 kHz to 40 kHz. This is reestablished by a 4th order propagation delay compensator 337, which acts like a negative delay within the aforementioned frequency range. The overall filter chain provides a flat amplitude (+/−0.5 dB) and phase (+/−2 degree) response within the IF frequency range and it provides in excess of 50 dB attenuation for frequencies above 90 kHz. Thus, sufficient suppression of the unwanted upper sideband is achieved for CB frequencies greater than 25 kHZ. For low frequency operation the upper sideband must be additionally suppressed by means of a tunable notch filter 338. However, the dynamic range is then limited to approximately +/−500 Hz because of the narrow bandwidth of the notch. The additional propagation delay for the unattenuated lower sideband is negligible for CB frequencies greater than 1.5 kHz which thus represents the low frequency limit of the operating range. The high frequency limit of 2 MHz is imposed by the degradation of the performance of the mixer at high frequencies.

Phase locked loop frequency detector 240: The phase locked loop (PLL) frequency detector serves two purposes. Firstly, it is used for measuring the IF frequency and thus the resonance frequency of the CB. Secondly, it provides a tracking oscillator signal which is phase locked with respect to he IF signal.

Referring again to FIG. 2 the PLL consists of a phase-frequency detector 241, which compares the IF signal with the signal of the tracking oscillator 242. The error signal from this detector is filtered in a proportional-integral feedback amplifier 243, which in turn controls the frequency of the tracking oscillator. The phase-frequency detector 241 consists of two complementary detectors. One detector is optimized for rapidly synchronizing the tracking oscillator with the IF frequency during the lock-in phase.

Once synchronization has been achieved a high precision phase detector consisting of an analog multiplier takes over. The operating point of the PLL is such that the tracking oscillator and the IF signal are mutually 90 degrees out of phase and, thus, the phase detector becomes virtually insensitive to amplitude fluctuations. This, in turn, eliminates the need for a nonlinear limiting amplifier for the IF signal which would deteriorate the signal to noise ratio of the phase detector.

The bandwidth of 5 kHz of the PLL is matched to the IF frequency range. In the locked-in state the PLL acts as a frequency detector since the control voltage that is applied to the tracking oscillator is a measure of the instantaneous IF frequency. An ultra-linear voltage controlled oscillator is used in the tracking oscillator which assures precise frequency measurements over the full IF frequency range from 30 kHz to 40 kHz. The default capture range of the tracking oscillator is slightly larger than +/−5 kHz centered at 35 kHz. This capture range can be manually adjusted (termed capture range limiting) to cover a smaller interval (between +/−5 kHz and +/−100 Hz) centered at any frequency within the IF range. Resorting to careful filtering exceptional spectral purity of the tracking oscillator signal is achieved and harmonic distortions are below the 1% level. Other functions of the HPCO require a tracking oscillator signal which is in phase with respect to the IF signal. This is achieved by means of a broad band $\pi/2$ phase shift circuit 244, which is described below in connection with FIG. 7 and the output mixer.

Balancing network 250: Two modes of excitation are conceivable for the CB-resonator, namely a linear feedback mode and a tracking oscillator mode. In the linear feedback mode the CB driving signal is proportional to the CB response signal. This is the preferred operating mode for high Q resonators. In the other mode, the CB driving signal is proportional to the tracking oscillator signal. This operating mode is particularly advantageous when working with low Q CB-resonators which provide only little selective amplification at their resonance frequency. In such situations linear feedback may be unsatisfactory as it cannot be excluded that self oscillation sets in at some spurious side resonance which has higher gain than the CB resonance. In the tracking oscillator mode, however, excitation of side resonances with frequencies outside the capture range of the PLL is effectively suppressed. The capture range of the PLL can be manually adjusted as explained in the paragraph about the PLL frequency detector. This enables the user to flexibly adapt to the experimental situation. The tracking oscillator signal and the IF signal are combined with adjustable weights in the balancing network. Thus, the user can select any linear combination of the two operating modes that gives best results.

Figure 4A:
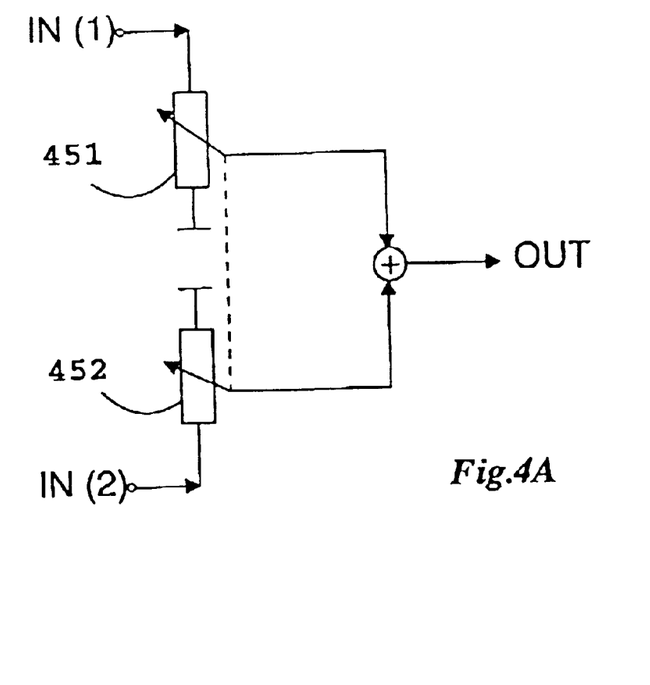
FIG. 4A illustrates a balancing network of the system of FIG. 2 according to the present invention.
Figure 4B:
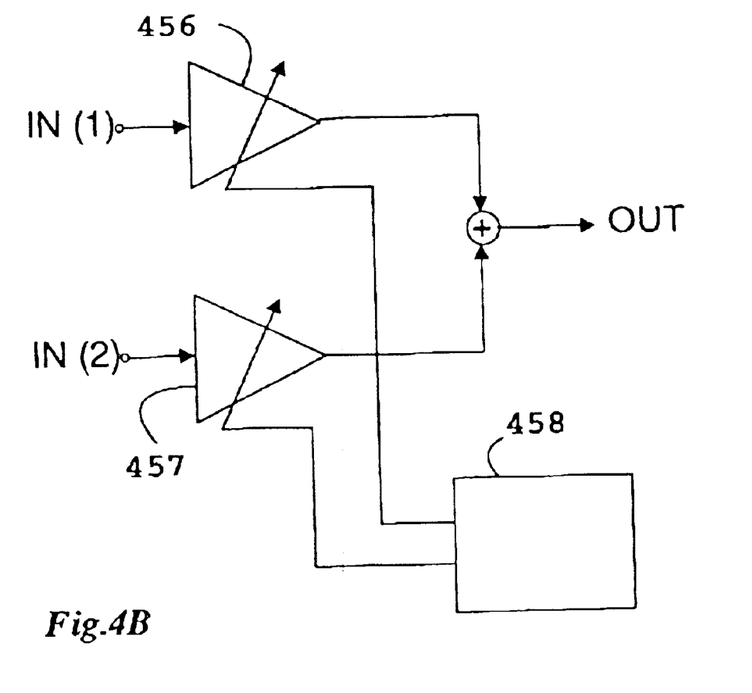
FIG. 4B illustrates an improved balancing network of the system of FIG. 2 according to the present invention.

A basic implementation of the balancing network is shown by FIG. 4A. The CB response signal IN(1) and the tracking oscillator signal IN(2) are connected to two mechanically coupled potentiometers 451, 452 in such a way that for a clockwise rotation of the potentiometer the weight of the CB response signal is increased and the weight of the tracking oscillator signal is decreased.

In an improved variant of the balancing network (FIG. 4B), two adjustable amplifiers 456, 457 replace the potentiometers of the previously described implementation. The gain of these amplifiers is controlled by a separate circuit 458, which allows to adjust for arbitrary weights of the two input signals by a suitable selection of the gain control voltage. One feasible operation mode is characterized by periodically switching between a linear feedback and a tracking oscillator excitation. In addition, dynamic adjustment, as required by an application, can be easily performed.

Figure 5:
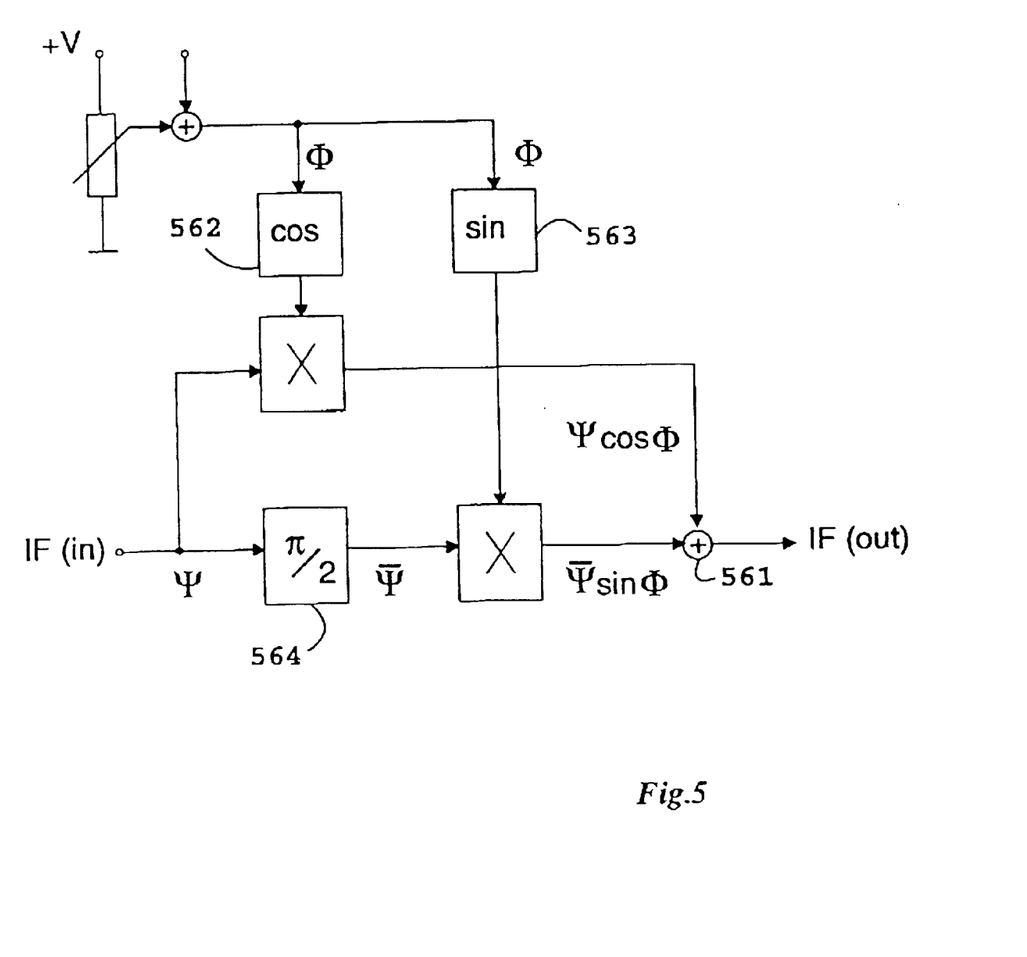
FIG. 5 illustrates components of a phase shifter of the system of FIG. 2 according to the present invention.

Adjustable phase shifter 260: The broad band phase shifter is used to shift the phase of the IF signal by a fixed amount. The phase shift is constant within an error of less than 0.5 degree over the entire IF frequency range. The main components of the phase shifter are illustrated by FIG. 5: The IF(in) signal and its quadrature component (90 degree phase shifted signal 564) are summed with weights cos Φ and sin Φ, respectively. The result of the summation 561 is an IF(out) signal which is phase shifted with respect to the input signal by an angle Φ. Using state of the art angular function generators 562, 563 the phase shift can be adjusted with an accuracy of better than 1 degree. Moreover, the scheme is well suited for precise phase modulation up to several 100 Hz modulation frequency and up to a phase swing of +/−180 degrees.

Amplitude regulator 270: The purpose of the amplitude regulator is to maintain a constant preset vibration amplitude of the CB-resonator. The problem is solved in this embodiment as follows (referring again to FIG. 2): The amplitude of the CB-response signal is adjusted by selecting the appropriate gain factor of the input amplifier 220 and by regulating for a constant 1 Vrms IF signal amplitude. This amplitude is measured by means of synchronous rectifier 271, which will be explained below with reference to FIG. 6. Deviations of the measured IF amplitude from the nominal value (NV) are processed by a proportional-integral feedback amplifier 272. The output signal from this amplifier modulates the output signal of the phase shifter 260 by means of an analog multiplier 273.

The output signal of the feedback amplifier is also a relative measure for the amplitude of the driving signal of the CB and, therefore, is made externally available for relative Q-factor measurements.

Figure 6:
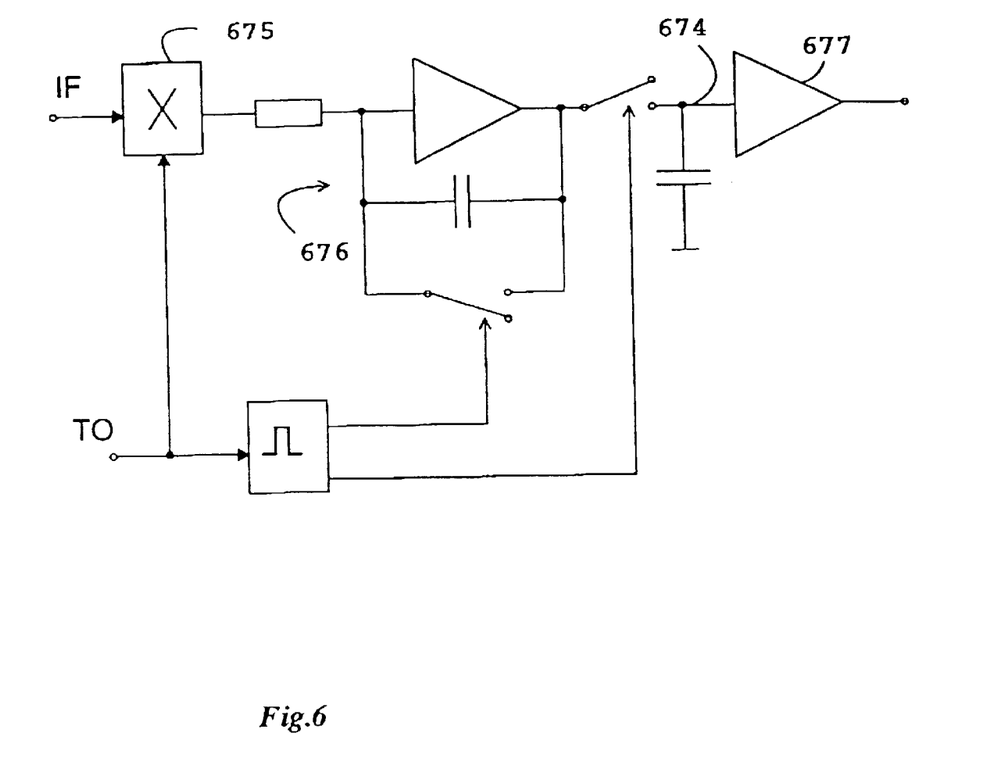
FIG. 6 illustrates components of a synchronous rectifier of the system of FIG. 2 according to the present invention.

A schematic diagram of the synchronous rectifier 271 is depicted in FIG. 6. The rectifier is basically a lock-in detector which provides intrinsically a 3 dB improvement of the signal to noise ratio compared with a standard rms-detector. A general problem with rectification is the generation of even harmonics. These harmonics must be suppressed as they else would distort the amplitude of the IF signal and—in turn—deteriorate the spectral purity of the HPCO output signal. A switched capacitor type filter 674 is used for this purpose. By phase locking the filter clock signal with the IF signal the harmonics can be made to vanish almost completely without introducing a large propagation delay. Thus, the bandwidth of the amplitude feedback controller is not impaired by this filter. The filter operates in the following way: The output signal of the analog multiplier 675 which performs the synchronous rectification is integrated by an integrator 676 over one period of the tracking oscillator signal TO. At the end of the period the result of the integration is stored in an analog memory formed by a sample-hold circuit 677. Then the integrator is reset and a new sequence is started. Because of the integration the rectified voltage is inversely proportional to the clock frequency. This effect is compensated for by adjusting the set-point of the amplitude controller accordingly.

Output mixer 233: The processed IF signal is back converted to the CB frequency by means of a single side band mixer employing the so-called "phase meithod," illustrated in FIG. 7. The IF signal and the local oscillator LO signal and their respective quadrature (90 degrees phase shifted) signals are mixed in two mixers 734, 735 Each of the mixers produces a lower and an upper sideband. The lower sideband signals are in phase whereas the upper side band signals are exactly 180 degree out of phase. Therefore, by adding (or subtracting) the output signals of the two mixers the upper (or the lower) sideband is suppressed.

Figure 7:
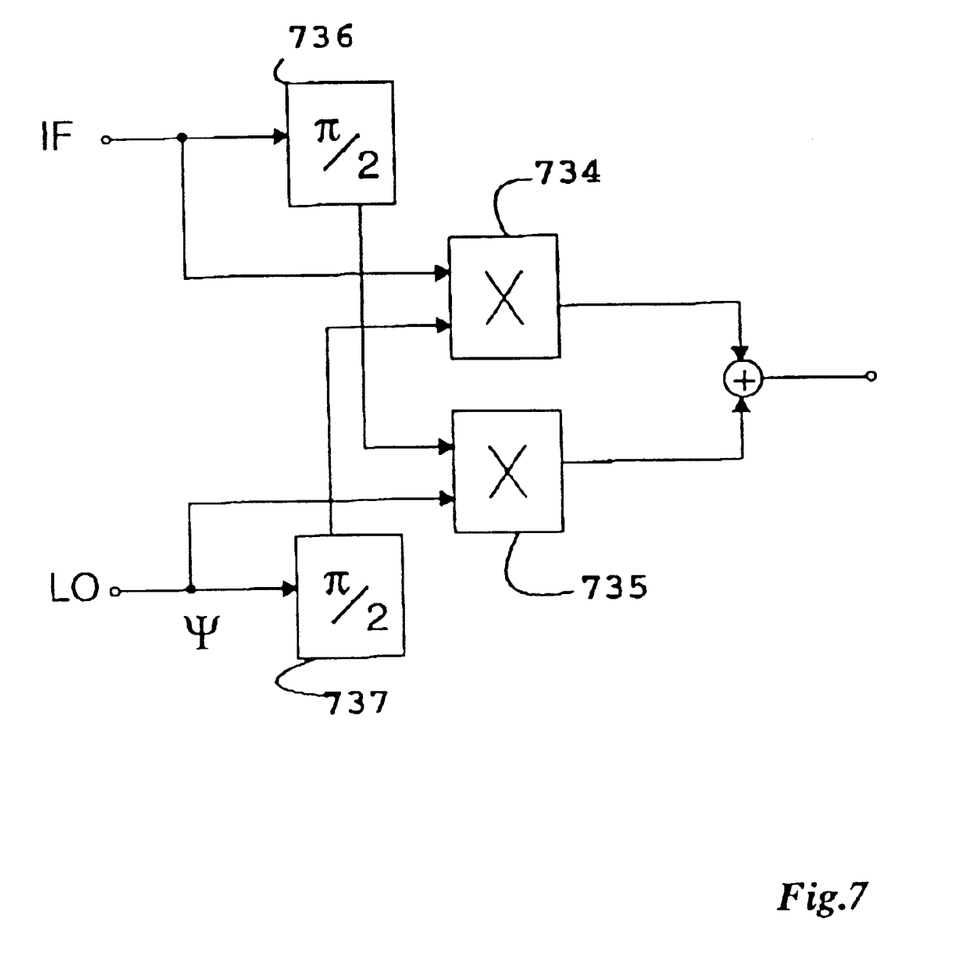
FIG. 7 illustrates components of a single side band mixer of the system of FIG. 2 according to the present invention.
Figure 8:
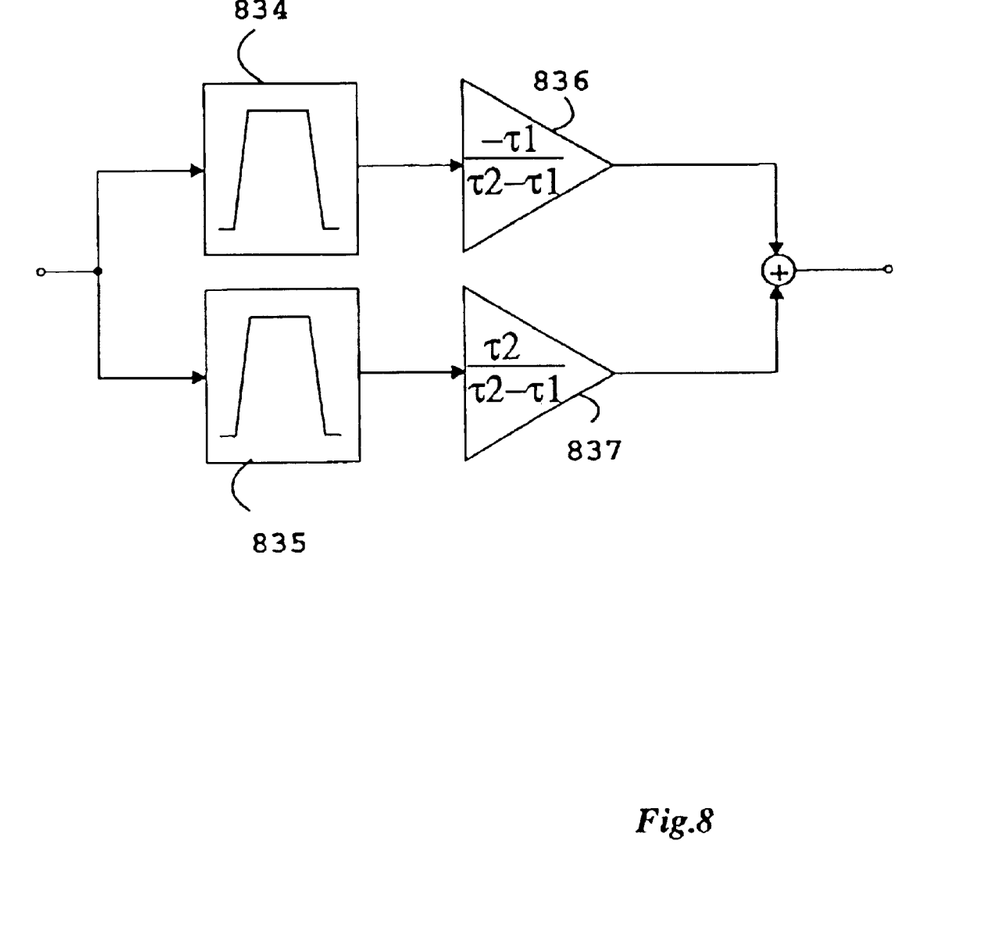
FIG. 8 illustrates components of a phase shifter shown in FIG. 7 according to the present invention.

In order to achieve adequate sideband rejection precise phase shifters 736, 737 are required. For example, suppression of the unwanted sideband by 40 dB requires that the amplitude and phase errors be less than 1% and 0.5 degree, respectively. A special filter was developed which meets these requirements over the entire IF frequency range from 30 kHz to 40 kHz As it is not possible to design a filter with an ideal flat phase and amplitude response, approximation schemes are required. The phase shifters, one of which is depicted in FIG. 8, hence consists of two 2nd order subfilters 834, 835, which both are characterized by the following properties: Unity gain, A=1, to first order flat gain response, $dA/d\omega=0$, and a phase shift of $\Phi=\pi/2$ at the center frequency $\omega_0=35$ kHz. However, the propagation delays at $\omega_0$, $\tau_1=d\Phi_1/d\omega$ and $\tau_2=d\Phi_2/d\omega$, of the subfilters are different. By adding the output signals of the two subfilters 836, 837 with weights $\tau_2/(\tau_2-\tau_1)$ and $-\tau_1/(\tau_2-\tau_1)$, respectively, a phase shifter is obtained which fulfills the requirements of flat phase and frequency response to first order. By proper selection of the propagation delays of the two subfilters it is indeed possible to keep the amplitude and phase errors at sufficiently low levels for achieving at least 40 dB sideband rejection over the entire IF frequency range. The broad band $\pi/2$-phase shifters 244, 564 mentioned above in connection with the PLL circuit 240 and the adjustable phase shifter 260 are designed accordingly though a larger phase error can be tolerated in those cases. The same filter design can be applied by changing the weights of the subfilters accordingly to achieve a phase response which corresponds to a negative propagation delay while retaining an essentially flat amplitude response. Thus the filter can be used to compensate for propagation delays arising from filters (see input mixer) and also from transducers and detectors used for exciting and sensing the CB vibration. It is important to note that a flat phase response of the overall system is a prerequisite for proper tracking of the resonance frequency.

Figure 9:
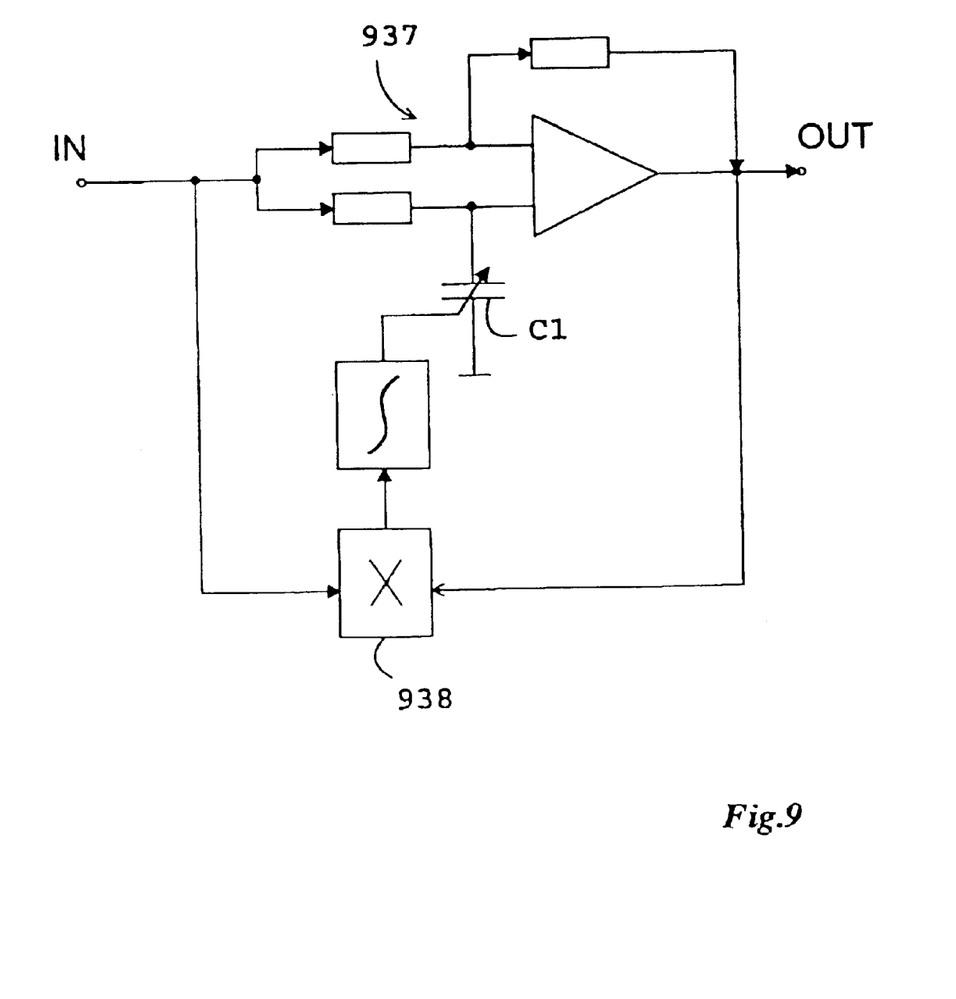
FIG. 9 illustrates components of a phase shifter for a local oscillator of the system of FIG. 2 according to the present invention.

The boundary conditions for the phase shifter of the local oscillator are complementary to those of the broadband IF phase shifter, described above, as the signal bandwidth is extremely narrow but the frequency can have any value between 30 kHz and 2 MHz. A tunable first order all-pass filter 937, as shown in FIG. 9, is preferably employed as a phase shifter under such conditions. Adjustment of the 90 degree phase shift is performed by a feedback circuit. The relative phase between the input and output signal of the all-pass filter is measured by means of an analog multiplier 938. The integrated error signal from the multiplier controls the capacitance C1, a varactor diode, of the all-pass filter. In this way a tuning range of about one octave is readily obtained using state of the art tuning diodes. A larger tuning range is achieved by splitting it up into several overlapping octaves. An additional control electronics (not shown in FIG. 9) performs automatic switching between the different ranges.

Local Oscillator 232: Extremely low phase noise of the local oscillator is decisive for exploiting the sensitivity of the HPCO frequency detector. A commercially available 30 MHz synthesized function generator was used for this purpose.

We claim:

1. An apparatus for controlling mechanical oscillator means, said apparatus comprising:

transducer means for transducing mechanical vibrations into an electrical signal and vice versa; and feedback loop means connected to said transducer means for exciting vibrations of said mechanical oscillator means;

wherein said feedback loop means includes:

means for generating a first feedback input signal and means for generating a second feedback input signal; and balancing network means for combining said first and second feedback input signals with adjustable weights for forming a single feedback signal, wherein said first feedback input signal generating means includes a frequency mixer, coupled to receive a reference frequency and said electrical signal, to provide an output to said balancing network means.

2. The apparatus in accordance with claim 1, wherein the second feedback input signal generating means comprises detection means for determining at least one of phase and frequency shifts in the vibrations of the mechanical oscillator means.

3. The apparatus in accordance with claim 1, wherein the second feedback input signal generating means comprises tracking oscillator means.

4. The apparatus in accordance with claim 1, wherein the second feedback input signal generating means comprises voltage controlled oscillator means.

5. The apparatus in accordance with claim 1, further comprising means for generating the reference frequency and frequency mixing means including said frequency mixer for shifting the frequency of the mechanical oscillations.

6. An apparatus for controlling a mechanical oscillator means, said apparatus comprising:

transducer means for transducing mechanical vibrations into an electrical signal and vice versa;

feedback loop means, connected to said transducer, for exciting vibrations of said mechanical oscillator means,
      wherein said feedback loop means includes means for generating a first feedback input signal and means for generating a second feedback input signal, and balancing network means for combining said first and second feedback input signals with adjustable weights for forming a single feedback signal; and means for generating a reference frequency and frequency mixing means for shifting the frequency of the mechanical oscillations, said mixing means being positioned before and after the balancing network means in the feedback loop means.

7. An apparatus for controlling mechanical oscillator means, said apparatus comprising:

transducer means for transducing mechanical vibrations into an electrical signal and vice versa;

feedback loop means, connected to said transducer means, for exciting vibrations of said mechanical oscillator means,
      wherein said feedback loop means includes means for generating a first feedback input signal and means for generating a second feedback input signal, and balancing network means for combining said first and second feedback input signals with adjustable weights for forming a single feedback signal; and means for generating a reference frequency and frequency mixing means for shifting the frequency of the mechanical oscillations, said mixing means including analog multiplying means and phase compensated filter means for suppressing one sideband generated by said multiplying means.

8. The apparatus in accordance with claim 1, wherein the feedback loop means further comprises gain adjustable amplifying means, the control signal for which is derived from synchronous rectifying means.

9. An apparatus for controlling mechanical oscillator means, said apparatus comprising:

transducer means for transducing mechanical vibrations into an electrical signal and vice versa; and feedback loop means, connected to said transducer means, for exciting vibrations of said mechanical oscillator means,
      wherein said feedback loop, means includes:
         means for generating a first feedback input signal and means for generating a second feedback input signal; and
         balancing network means for combining said first and second feedback input signals with adjustable weights for forming a single feedback signal, and wherein the feedback loop means further comprises adjustable phase shifting means using the feedback signal and its quadrature signal as an input.

10. Device comprising the apparatus according to claim 1 for at least one of observing and manipulating a surface, in particular in or combined with a scanning probe microscope.

11. Method for controlling a mechanical oscillators comprising,:

transducing mechanical vibrations into an electrical signal and vice versa; and feeding back a signal for exciting vibrations of said mechanical oscillator, wherein said feedback signal is generated using at least two feedback input signals and passing said feedback input signals through a balancing network for combining said feedback input signals with adjustable weights to said feedback signal; and wherein a first feedback input signal is generated by frequency mixing a reference frequency and said electrical signal, to provide an output to said balancing network.

12. The method of claim 11, wherein said first feedback input signal is generated using the electrical signal generated from a transduced signal, and a second feedback signal is generated by a phase tracking oscillator circuitry.

13. An apparatus for controlling a mechanical oscillator, said apparatus comprising:

a transducer for transducing mechanical vibrations into an electrical signal and vice versa; and a feedback loop connected to said transducer for exciting vibrations of said mechanical oscillator, wherein said feedback loop includes:
  a first feedback signal generator for generating a first feedback input signal based on the electrical signal, and a second feedback signal generator for generating a second feedback input signal; and
  a balancing network for combining said first and second feedback input signals with adjustable weights for forming a single feedback signal,
  wherein said first feedback input signal generator includes a frequency mixer, coupled to receive a reference frequency and said electrical signal, to provide an output to said balancing network.

14. The apparatus in accordance with claim 13, wherein the second feedback input signal generator comprises a detector for determining at least one of phase and frequency shifts in the vibrations of the mechanical oscillator.

15. The apparatus in accordance with claim 13, wherein the second feedback input signal generator comprises a tracking oscillator.

16. The apparatus in accordance with claim 13, wherein the second feedback input signal generator comprises a voltage controlled oscillator.

17. The apparatus in accordance with claim 13, further comprising a second mixer, coupled to receive an input from said balancing network and said reference frequency, for providing an output to said transducer.

18. The apparatus in accordance with claim 1, wherein said frequency mixer includes an analog multiplier and a phase compensated filter for suppressing one sideband generated by said analog multiplier.

19. The apparatus in accordance with claim 13, wherein said feedback loop operates at an intermediate frequency, generated by said mixer mixing the electrical signal representing an oscillating frequency with said reference frequency, and
  wherein said transducer comprises an optoelectric transducer, and a piezoelectric transducer operatively coupled to said mechanical oscillator.

20. The apparatus in accordance with claim 13, wherein the feedback loop further comprises adjustable phase shifting means using the feedback signal and its quadrature signal as an input.

* * * * *